United States Patent [19]

Alfke

[11] 4,084,082
[45] Apr. 11, 1978

[54] PROGRAMMABLE COUNTER

[75] Inventor: Peter H. Alfke, Los Altos Hills, Calif.

[73] Assignee: Fairchild Camera and Instrument Corporation, Mountain View, Calif.

[21] Appl. No.: 731,242

[22] Filed: Oct. 12, 1976

[51] Int. Cl.² .......................................... H03K 21/36
[52] U.S. Cl. .......................... 235/92 DM; 235/92 CC; 235/92 PE; 235/92 R; 328/48
[58] Field of Search ....... 235/92 PE, 92 DM, 92 CC, 235/92 PL, 92 DP; 328/48; 307/225 R

[56] References Cited

U.S. PATENT DOCUMENTS

| 3,230,352 | 1/1966 | Grondin et al. | 235/92 DM |
| 3,548,320 | 12/1970 | Roberts et al. | 235/92 CC |
| 3,581,066 | 5/1971 | Maure et al. | 235/92 CC |
| 3,824,379 | 7/1974 | Tomisawa et al. | 235/92 PE |
| 3,863,224 | 1/1975 | Alexander | 235/92 PE |

Primary Examiner—Joseph M. Thesz
Attorney, Agent, or Firm—Alan H. MacPherson; Henry K. Woodward; Robert C. Colwell

[57] ABSTRACT

A programmable counter is described having three cascaded counters, the first one of which is a dual modulus prescaler. The second counter is a resettable binary counter which is fed information from a programmable read-only memory as to the numbers of times the prescaler divisions are to be repeated. The third counter is a binary counter which further divides the frequency and controls the repetition numbers delivered by the programmable read-only memory to the presettable binary counter.

3 Claims, 1 Drawing Figure

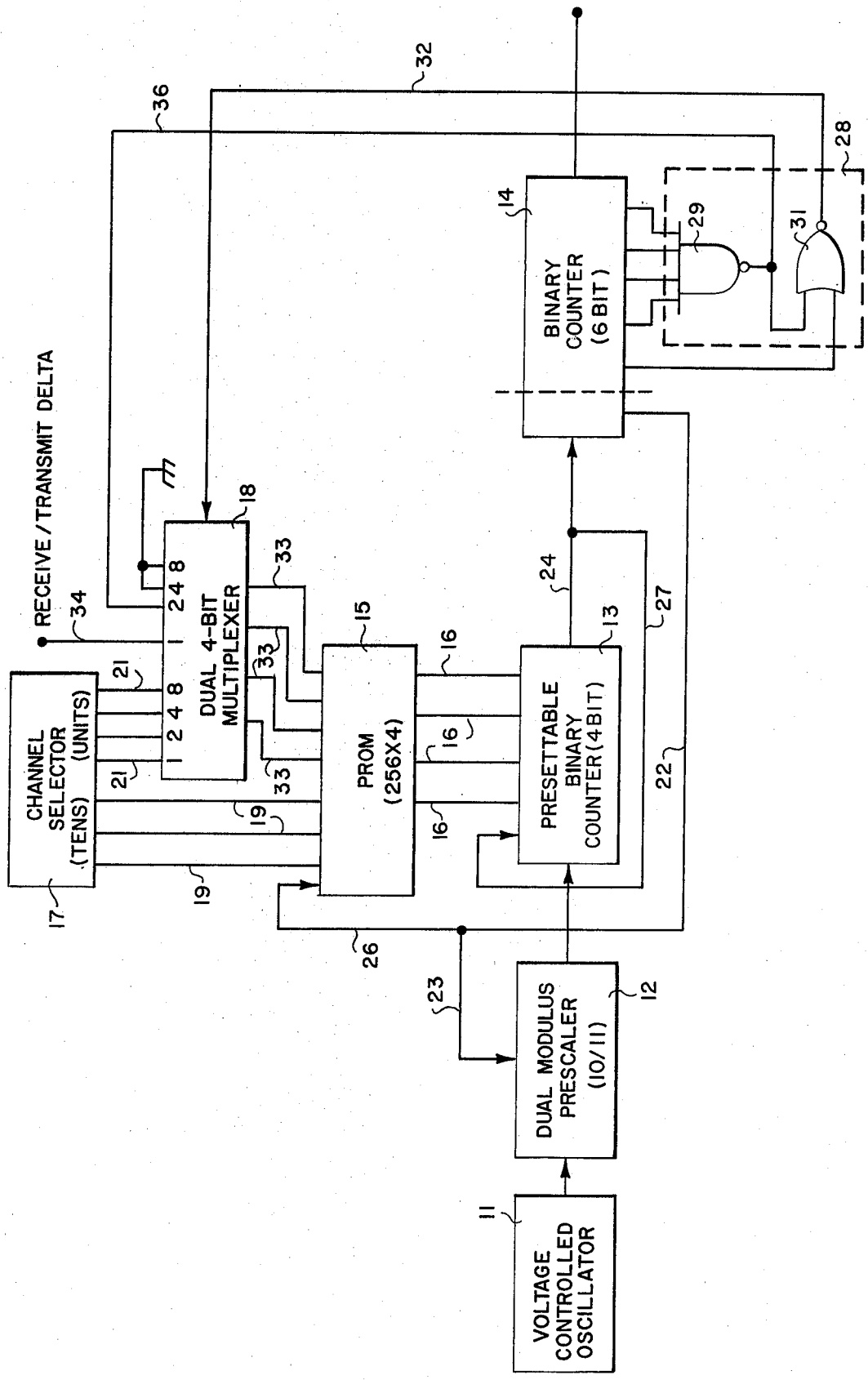

PROGRAMMABLE COUNTER

BACKGROUND OF THE INVENTION

The present invention relates to programmable counters and, more particularly, to a programmable counter which enables any integer value in a selected range to be obtained.

Programmable counters are now finding wide usage, particularly in electronic control arrangements. For example, programmable counters are important components of frequency synthesizers of the type widely used as digital tuners for communication transmitters and receivers. In general, a programmable counter is a frequency divider whose divisors is variable.

Most programmable counters now available suffer from some serious limitations. For example, basic programmable counters have speed limitations, i.e., are unable to properly handle high input frequencies. While one might think that the speed limitations could be handled by inserting a fixed value prescaler between the frequency to be divided and the counter, insertion of such a prescaler results in loss of numeric resolution.

SUMMARY OF THE INVENTION

The present invention is a programmable counter providing high resolution in a selected range. In its basic aspects, the counter is fed from an oscillator or other means for producing an electrical oscillation having a frequency significantly higher in value than the frequency of a desired output count; and includes means, e.g., a dual modulus prescaler, for dividing the incoming frequency by any one of a plurality of relatively prime numbers, and means for repeating the division for particular numbers of times corresponding to the relatively prime numbers. The counter further includes means which reacts to a division a predetermined number of times by a first relatively prime number by directing the divider to divide the frequency also by a second relatively prime number, and by directing the repetition of the second division a number of times which corresponds to the second divisor. It has been found that if the individual number of repetitions of the two separate divisions are appropriately selected for a specific range of divide ratios, any desired output integer value in the range can be selected.

In many instances, the integer range over which it is desired that a programmable counter operate with high resolution requires very high divide ratios. The programmable counter of the invention also includes an arrangement for advancing the high resolution divide ratio range to encompass a desired range. More particularly, the programmable counter further includes means for dividing the count produced by the above structure by a pair or more of relatively prime numbers to not only advance the divide ratio into the desired range but also to produce the specific integer value desired in the range. Again, the relatively prime numbers which are selected for such division depend on the relationship of the desired output to the incoming frequency.

The invention includes other features and advantages which will be discussed or will become apparent from the following more detailed description.

BRIEF DESCRIPTION OF THE DRAWING

With reference to the single sheet of drawing:

FIG. 1 is a combined block and logic diagram of a preferred embodiment of the programmable counter of the invention.

DETAILED DESCRIPTION OF THE PREFERRED EMBODIMENT the programmable counter of the invention is particularly useful as the programmable counter of a frequency synthesizer of the type now becoming widely used as digital tuners for communication transmitters and receivers. Such a programmer is typically included in a feedback loop from a voltage controlled oscillator to a phase/frequency comparator which directs correction of the voltage controlled oscillator frequency as controlled by the output of the programmable counter. The programmable counter of the invention will be described in connection with its use in such a synthesizer.

With reference to FIG. 1, a voltage control oscillator referred to by the reference numeral 11 is included to provide the basic electric oscillation which is to be divided. While the output frequency of oscillator 11 will vary depending upon the controlling voltage, it will be recognized from the following discussion that such a varying electrical oscillation is not needed for the purposes of the invention. Insofar as the counter is concerned, any means for producing an electrical oscillation having a constant or varying frequency which is significantly higher than the desired output will suffice.

The output of the voltge control oscillator 11 is directed to three cascaded counters 12, 13 and 14, respectively. Counter 12 is a dual modulus prescaler, such as the 10/11 prescaler designated Model No. 11C90available from the Semiconductor Division of Fairchild Camera and Instrument Corporation, Mountain View, Calif. As will be discussed in more detail hereinafter, prescaler 12 divides the frequency of the electrical oscillation received by it from the oscillator 11 either by the divisior 10 or the divisor 11. While for practical and availability reasons a 10/11 prescaler is used, it will be appreciated that other prescaler arrangements could be employed. It is only necessary for reasons which will become apparent hereinafter that the divisors provided by the prescaler by "relatively prime numbers". That is, the divisors should not themselves have a common factor greater than one. And, while a dual modulus prescaler is most simply used, a prescaler having more than two relatively prime divisors could be used.

Counter 13 is a synchronous and synchronously presettable binary counter. That is, it is a counter which can be preset from input terminals to count (divide) input changes of state by any number selected within its range. A counter suitable for this purpose is the one available from the Semiconductor Division of Fairchild Camera and Instrument Corporation, Mountain View, Calif. under the model designation No. 9316.

The third of the three cascaded counters, couner 14 is a simple ripple binary counter which acts not only to divide the frequency of the output from counter 13 but also to control operation of both the prescaler 12 and the counter 13.

An understanding of the relationship of the cascaded counters and other components of the invention which control their operation can best be obtained from a description of its function and operation. As one salient aspect of the invention, the combination of the prescaler 12 with the counter 13 enables all integer values within a specific range to be achievable. That is, it has been found that by appropriately selecting the numbers of times counter 13 repeats the ten and eleven divisions performed by prescaler 12 one can obtain all integer divide ratios within a specific range. Mathmatically, values can be chosen for A and B (the repetition numbers) which result in:

$$(11 \times A) + (10 \times B)$$

providing all integer divide ratios within a specific range. In the preferred application of the instant invention, the counter 13 is a four-bit presettable binary counter with the result that the values of A and B are limited, as a practical matter, to between 2 and 16. With prescaler 12 dividing by 10 or 11 and empirically choosing divide values for A and B between 2 and 16, it has been found that the incoming frequency from voltage controlled oscillator 11 can be divided to any integer value between 132 and 246. The specific division repetitions performed by the counter 13 are delivered thereto in 16-complement form from a programmable memory such as the PROM 15. The four flow lines 16 extending between the PROM and the counter 13 represent connections between the binary output of the PROM to the binary input of the counter 13. The address information to the PROM which controls its binary output is delivered thereto by a channel selector 17 and multiplexer 18. As illustrated, channel selector 17 has three output lines 19 representing "tens" digits of a selected channel and four output lines 21 representing "units" digits. The "tens" output lines 19 are directly connected to address input lines of PROM 15 whereas the "units" lines are connected through the multiplexer 18 to such PROM for reasons which will be discussed hereinafter.

It will be appreciated that although the programmable memory is most conveniently provided as a PROM, a read/only memory (ROM) could also be used to deliver address information to the counter 13.

Means are included for alternating the divisor provided by the prescaler 12 between ten and eleven. That is, the completion of a repetition by counter 13 of one of the divisions by ten or eleven will appear on its output line and cause the first bit of the ripple binary counter 14 to change its state, which change of state will be transmitted to the prescaler 12. Lines 22 and 23 are shown representing the flow of such a change of state at the first bit of the ripple binary counter to the control input of the prescaler 12. Flow line 22 also connects with a flow line 26 connected to the PROM for also directing it to deliver to the counter 13 a new repetition number (a new value of A or B, as the case may be) to the counter 13 on such a completion. It is to be noted that the output of counter 13 is connected to its preset input via a line 27 so that when the counter reaches its terminal count, it will again start counting (dividing) by the 16-complement of the value which is fed therein from PROM 15.

As mentioned previously, the range of divisors over which it may be desired to be able to select all integer values will often be many times greater in value than can be handled merely by counters 12 and 13. This is true, for example, in a programmable counter used in a frequency synthesizer for communication where it is desirable to be able to achieve any selected frequency range between, say, 4000 and 8000 times the reference frequency. As another salient feature of the instant invention, it provides means for dividing the count which otherwise would appear on the output line 24 of the counter 13 to advance the divide ratio without loss of the numeric resolution obtained by the combined action of the counters 12 and 13. A binary counter, such as the counter 14, can by itself act to divide the frequency of the output of counter 13 a selected number of times to produce a large divide ratio. However, if the binary counter 14 alone was used for this purpose, the high resolution achieved by the combination of the prescaler 12 with the counter 13 would be lost. That is, the specific integer values provided at the output of the counter 13 would be spaced from one another by the divisor provided by the counter 14. For example, if the counter 14 is considered a "divide by 32" counter (five effective bits) adjacent integer divide values would be spaced 32 integer values apart.

As a particularly salient feature of the instant invention, the counter 14 is combined with a decoder 28 and the multiplexer 18 to direct the programmable read-only memory 15 to deliver values to the binary counter 13 which will prevent this loss of resolution. From the functional standpoint, the binary counter 14 "advances" the output of the apparatus to the desired integer value range by directing the PROM 15 to deliver at least two different sets of relatively prime repetition numbers (A's and B's) to the counter 13. More particularly, counter 14 directs the PROM through the decoder 28 and the multiplexer 18 to deliver one set of repetition numbers (A's and B's) to the counter 31 of its 32 counts, but directs the PROM to deliver another set of repetition numbers to the counter 13 the thirty-second time. To this end, the decoder 28 includes a gate tree made up of a NAND gate 29 and a NOR gat 31. As illustrated, NAND gate 29 has four inputs which are connected with four bits of the counter 14 and NOR gate 31 has two inputs, one of which is connected to the output of NAND gate 29 and the other one of which is connected to the remaining bit output of the counter 14. It will be recognized that with such an arrangement, the output of the gate 31 appearing on line 32 will have the same state for all except one of the 32 counts of the last five bits of counter 14.

Line 32 is directed to the "select" input of the multiplexer 18 to control whether the "unit" set of address lines 21 from the channel selector or the second set of address lines to be discussed infra are allowed to communicate via multiplexer output lines 33 with PROM 15. In order to facilitate the description, the unit set of address lines 21 connected to the multiplexer will be referred to below frequenctly as the "lefthand input side" of the multiplexer, and the other set of address lines will be referred to as the "righthand input side" of the multiplexer.

Mulitplexer 18 is directed by the presence on line 32 of the state which appears thereon only one of the 32 counts made by counter 14 to pass to PROM 15 the information on its lefthand input side. This information, when coupled with the information delivered to the PROM by the "tens" output lines of the channel selector, determines one set of the repetition numbers (A's and B's) delivered by the PROM to the counter 13. At all other times, the information on the righthand input side of the multiplexer is delivered with the information on the "tens" output lines of the channel selector to the PROM. This information provides the address for a second set of the repetition numbers to be delivered by the PROM to the counter 13.

As an important aspect of the arrangement, the information on the righthand input side of the multiplexer is delivered to the PROM in a manner which precludes it being confused by the PROM with "unit" information. In this connection, it is to be noted that multiplexer 18 needs all four output lines 33 to provide unit information in BCD code to the PROM. However, the use of four lines enables the multiplexer to deliver to the PROM more binary information than is required merely to convey the unit information. That is, the unit information will vary between decimal digits 0–9, whereas the muliplexer can provide binary information on its four output lines indicating with a binary code a value in BCD code from 0 and 15. Thus, in order to distinguish between "unit" information addressing of the PROM 15 by mulitplexer 18 from addressing the PROM with information on the righthand input side of such multiplexer, only those binary outputs representing BCD numbers greater than nine are used when the multiplexer is passing to the PROM information on its righthand input side. To accomplish this in a manner, the "four" and "eight" input lines on the right-hand input side are made permanently active by grounding the same. Thus, when the PROM is looking at the information at the righthand side of the multiplexer 18 it will always be looking at a unit address that is 12 or larger, i.e., 12, 13, 14, or 15, depending upon the states of the remaining two lines.

In the preferred arrangement being described in which the programmable counter of the invention is part of a transceiver frequency synthesizer, one of the other two input lines on the righthand side of the multiplexer is used to convey address information to the PROM indicating whether the receive or transmit frequency of the channel selected is desired. That is, communications transceivers require for each selected channel two different frequencies, one for transmit and one for receive, separated by a constant delta, i.e., the so-called IF offset. Thus, input line 34 is used to provide that address information to the PROM required to select the set of repetition numbers which will select the output frequency for receive or transmit, as the case may be. It should be noted that the receive/transmit address information need only be provided to the PROM during the presence on line 32 of the state normally thereon — it need not be provided when the units information is being conveyed to the PROM.

The other input line at the righthand input side of the multiplexer, i.e., input line 36, also provides information relating to the receive/transmit delta. That is, the information provided on line 36 to the multiplexer and, hence, to the PROM 15 when it is operatively connected to the righthand input side of the multiplexer, relates to two different sets of repetition numbers for the receive/transmit delta information. One set of such repetition numbers enables the resulting frequency to be advanced without concern for the state of the receive/transmit mode of the apparatus, whereas the second set of repetition numbers takes into consideration such mode. In this connection, it is to be noted that line 36 is connected to the output of NAND gate 29 of decoder 28. It will be recognized that the output of NAND gate 29 will have a different state two out of the 32 divisions performed by counter 14. One of such times, however, will correspond with the "one out of 32" different state (the unique state) appearing on line 36. It will be remembered that when the multiplexer select line 36 is in its unique state, the multiplexer will allow passage of the unit information on the lefthand input side to the PROM, rather than any information on the righthand input side of such multiplexer. Thus, it is only the other one of the 32 times that the NAND gate 29 is in a different state that effective address information is provided by it to the input side of the multiplexer. This other time is, in effect, one of the 31 times that the multiplexer 18 is passing information on its right input side to the PROM 15. Thus, the PROM 15 will receive information one of such 31 times which specifically addresses that set of repetition numbers needed to distinguish between the receive and transmit modes of the apparatus.

It should be noted that although for simplicity decoder 28 has been described as "advancing" the output frequency 31 of its 32 times to get within range of the desired output count, and only once during its 32 times does it deliver the repetition numbers to the counter 13 required to obtain the exact desired count, other combinations of the two sets of repetition numbers can be provided to the counter 13 with the same results, e.g., the decoder 28 could direct multiplexer 18 to deliver the "unit" information to the PROM 15 or 16 of the 32 times. It is only necessary that the two sets of repetition numbers be provided a relatively prime number of times.

From the above it will be seen that the programmable counter of the invention enables any integer values in a selected integer range to be obtained. Moreover, its flexibility in selection of output integers in the range is not limited by the manner in which select information is delivered thereto. That is, the value of the channel information need not be directly related to the value of the desired output count.

Various modifications and departures from the preferred embodiment can be made without departing from the spirit of the invention. It is therefore intended that the coverage afforded applicant be limited only by the claims and their equivalent language.

I claim:

1. A programmable counter for dividing an electrical oscillation frequency which is significantly higher in value than the frequency of a desired output count, said output count falling within a set of potentially desired integer values requiring high divide ratios of a resulting frequency, comprising:

a modulus prescaler for dividing said electrical oscillation frequency by any one of a plurality of relatively prime numbers;

a presettable binary counter for repeating said division of said electrical oscillation frequency for numbers of times respectively corresponding to said relatively prime numbers;

programmable memory means connected to said presettable binary counter for furnishing thereto said numbers of times corresponding to said relatively prime numbers that said divisions of said frequency are to be repeated;

means responsive to repetition of said division by a first one of said relatively prime numbers by directing said modulus prescaler to divide said electrical oscillation frequency also by a second one of said relatively prime numbers, and by directing said presettable binary counter to repeat said division by said second relatively prime number for a number of times corresponding to said second relatively prime number whereby an electrical oscillation is produced having said resulting frequency which is a selected fraction of the frequency of the incoming electrical oscillation frequency;

a binary counter for dividing said resulting frequency at least two relatively prime number of times to advance the divide ratio to provide respectively both said set of potentially desired integer values and the desired output count in said set;

a decoder responsive to said binary counter for directing said programmable memory means to deliver said different relatively prime numbers of times said resulting frequency is to be repeated to said presettable binary counter;

a channel selector connected to said programmable memory means for directing the same to externally introduce information to said presettable binary counter indicative of said numbers of times said divisions are to be repeated; and a multiplexer which selectively delivers to said programmable memory means address information provided by said channel selector and said decoder.

2. A programmable counter according to claim 1 wherein the modulus prescaler is a dual modulus prescaler.

3. A programmable counter according to claim 2 wherein said multiplexer is interpositioned between said channel selector and said programmable memory means to selectively deliver to said programmable memory means binary coded information relating to one decade indicative of a selected channel and information from said decoder indicative of binary numbers greater than said decade.

* * * * *